United States Patent [19]
Hsieh

[11] Patent Number: 5,853,906
[45] Date of Patent: Dec. 29, 1998

[54] CONDUCTIVE POLYMER COMPOSITIONS AND PROCESSES THEREOF

[75] Inventor: Bing R. Hsieh, Webster, N.Y.

[73] Assignee: Xerox Corporation, Stamford, Conn.

[21] Appl. No.: 950,303

[22] Filed: Oct. 14, 1997

[51] Int. Cl.⁶ .................................................. B32B 9/00
[52] U.S. Cl. .............. 428/690; 252/519.33; 252/519.34; 427/66; 428/917; 430/59
[58] Field of Search ................. 252/500, 518.1, 252/519.4, 519.33, 519.34; 428/36.91, 409, 906, 690, 691, 917; 430/58, 59, 62, 75; 313/503–509; 427/66

[56] References Cited

U.S. PATENT DOCUMENTS

| | | | |
|---|---|---|---|
| 3,719,485 | 3/1973 | Ferro ........................................ | 430/62 |
| 5,232,804 | 8/1993 | Molaine ................................ | 430/75 X |
| 5,300,339 | 4/1994 | Hays et al. .......................... | 428/357 X |
| 5,549,851 | 8/1996 | Fukushima et al. ................ | 252/519 |
| 5,587,224 | 12/1996 | Hsieh et al. ........................ | 428/195 |

Primary Examiner—Michael Lusignan
Attorney, Agent, or Firm—John L. Haack

[57] ABSTRACT

A conductive coating comprising an oxidized oligomer salt, a charge transport component, and a polymer binder, for example, a conductive coating comprising an oxidized tetratolyidiamine salt of the formula

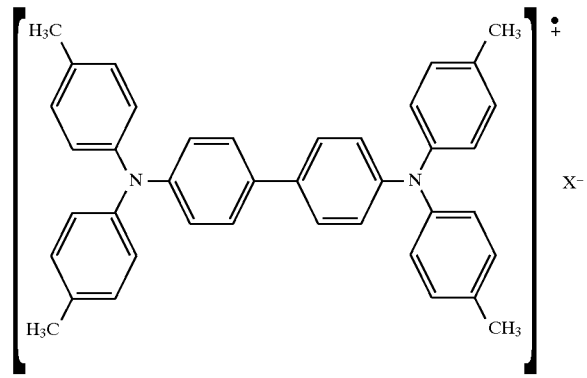

a charge transport component, and a polymer binder, wherein $X^-$ is a monovalent anion.

7 Claims, No Drawings

CONDUCTIVE POLYMER COMPOSITIONS AND PROCESSES THEREOF

REFERENCE TO COPENDING AND ISSUED PATENTS

Reference is made to commonly owned and assigned copending applications: U.S. Ser. No. 08/323,695 filed Nov. 18, 1994, entitled "CONTROLLABLY CONDUCTIVE POLYMER COMPOSITIONS FOR DEVELOPMENT SYSTEMS", which discloses thiophene containing conductive coatings for development apparatus resulted from doping with a triarylamine cation radical salts; U.S. Ser. No. 08/453,108 now U.S. Pat. No. 5,731,078 issued Mar. 24, 1998, entitled "DEVELOPING APPARATUS AND COATED ROLLER", which discloses conductive coatings resulting from doping with perfluoroacids; and U.S. Ser. No. 08/950,300, filed Oct. 14, 1997 entitled "CONDUCTIVE POLYMER COMPOSITIONS AND PROCESSES THEREOF", which discloses a conductive polymer coating comprising an arylamine charge transport compound, an oxidized arylamine charge transport compound salt, and a polymer binder, wherein the charge transport compound salt has a counter anion selected from the group consisting of hexafluoroantimonate and hexafluoroarsenate.

Attention is directed to commonly owned and assigned U.S. Pat. No. : 5,587,224, issued Dec. 24, 1996, entitled "DEVELOPING APPARATUS INCLUDING A COATED DEVELOPER ROLLER".

The disclosures of each of the aforementioned copending applications and patents are totally incorporated herein by reference.

BACKGROUND OF THE INVENTION

The present invention relates to conductive polymeric coating compositions having controllable, reproducible, and stable electrical conductivity of, for example, about 1.0 to about $10^{-12}$ S/cm or (ohm-cm)$^{-1}$. Coating compositions of the present invention with electrical conductivity in the range of $10^{-8}$ to $10^{-10}$ S/cm are useful anti-static materials or charge relaxation materials which have application, for example, in electrophotographic image development systems such as liquid image development systems or scavengeless and hybrid scavengeless development systems. Scavengeless development systems do not scavenge or interact with a previously toned image and thereby do not negatively affect image quality and are important in trilevel and highlight color xerography, reference for example, U.S. Pat. No. 4,078,929.

Two-phase conductive compositions are known and contain, for example, dispersions of conductive particles, such as carbon black or graphite, in an insulating polymer matrix, for example, dielectric binders such as a phenolic resin or fluoropolymer, and which conductive pigment loading concentration is near to the percolation threshold concentration. Conductive particle concentration levels at or near the percolation limit allow for conductive particle contact, resulting in a burst of conductivity, reference for example, commonly owned and assigned U.S. Pat. No. 4,505,573, to Brewington et al. The dielectric constant of conductive coatings and overcoatings typically can be from about 3 to about 5, and preferably of about 3. The desired conductivity is achieved by controlling the loading of the conductive particles. However, the low conductivity values required for electrophotographic image development systems and the large, intrinsic electrical conductivity of carbon black make it extremely difficult to achieve predictable and reproducible conductivity values. Very small changes in the loading of conductive particles near the percolation threshold can cause dramatic changes in the coating's conductivity. Furthermore, differences in particle size and shape can cause wide variations in conductivity at even a constant weight loading. Moreover, the percolation threshold approach to obtaining conductive coatings requires relatively high concentrations of conductive particles. At these concentrations, the coatings typically become brittle, and the mechanical properties the coating are controlled by carbon black content rather than the polymer matrix.

Another approach is to molecularly dope a polymer matrix with mixtures of a neutral charge transport molecule and its radical cation or anion. "Molecular doping" refers to the relatively low amounts of dopant added, compared to the aforementioned high loading concentrations of carbon black dispersions, to increase the conductivity of the polymer matrix. The resulting molecularly doped mixture is essentially a solid solution. No chemical bonding occurs between the dopant and the charge transport molecule so as to produce a new material or alloy. The doped polymer provides stable and controlled conductivity arising from molecular doping with dopants such as oxidizing agents. In the presence of an oxidizing dopant, partially oxidized charge transport moieties in the charge-transporting polymer act as hole carrier sites, which transport positive charges or "holes" through the unoxidized charge transport molecules. For example, Mort et al., *J. Electronic Materials,* 9:41 (1980), discloses the possibility of chemically controlling dark conductivity by co-doping a polycarbonate with neutral and oxidized species of the same molecule, tri-p-tolylamine, that is TTA, and TTA$^+$ respectively, where TTA$^+$ represents a cation radical salt of TTA. Limburg et al., in U.S. Pat. No. 4,338,222, disclose an electrically conducting, three-component composition comprising: a polymer matrix; an organic hole transport compound, particularly tetraaryl diamines, and oxidized species of the same molecule, which is the reaction product of the organic hole transport compound and an oxidizing agent capable of accepting one electron from the hole transport compound. Hays et al., U.S. Pat. Nos. 5,300,339 and 5,448,342, disclose an overcoating comprising at least three constituents: a charge transport compound, for example, especially an aryl diamine, a polymer binder, especially a polycarbonate or a polyethercarbonate, and an oxidizing agent. Hays et al., U.S. Pat. No. 5,386,277, further disclose an overcoating comprising two constituents: a charge transport polymer with tetraaryl diamine units in the main chain and an oxidant.

Coating compositions of the present invention have electrical conductivities in the range of about 1.0 to about $10^{-10}$ S/cm and are also useful in various applications such as: thin film transistor devices, see Dodabalapur et al., U.S. Pat. No. 5,574,291, and Tsumura; A. et al., U.S. Pat. No. 5,500,537; in electroluminescent devices, EP 686662-A2, U.S. Pat. Nos. 5,514,878, and 5,609,970, and A. J. Heeger, "Self-assembled Networks of Conducting polyaniline" in *Trends in Polymer Science,* 3, 39–47, 1995); in liquid crystal displays, U.S. Pat. Nos. 5,619,357 and 5,498,762; in electrochromic devices, U.S. Pat. Nos. 5,500,759, and 5,413, 739; in photochromic devices, U.S. Pat. No. 5,604,626; in rechargeable batteries, U.S. Pat. Nos. 4,987,042 and 4,959, 430; in secondary cells, U.S. Pat. Nos. 5,462,566 and 5,460,905; in electrochemical capacitors, U.S. Pat. Nos. 5,527,640, 4,910,645, 5,442,197 and 5,626,729; in photovoltaic cells, U.S. Pat. No. 5,482,570; in photodetectors, U.S. Pat. No. 5,523,555; in photosensitive imaging member, U.S. Pat. Nos. 5,616,440 and 5,389,477; in photographic coatings, U.S. Pat. No. 5,443,944; in formation of conductive polymer patterns, U.S. Pat. No. 5,561,030; in electroplating, U.S. Pat. Nos. 5,415,762, 5,575,898 and 5,403,467; in laser applications, Katulin, V. A. et al., *Sov. J. Quantum Electron.*, 14, 74–77 (1984), Hide et al., *Science* 273, 1833, (1996); and Tessler, et al., *Nature*, 382, 695 (1996); in polymer grid triodes, U.S. Pat. No. 5,563,424; in anticorrosion coatings, U.S. Pat. Nos. 5,532,025 and 5,441,772; in ferromagnetic or high magnetic spin coatings, Shiomi et al., *Synthetic Metals*, 85, 1721–1722 (1997), and references cited therein.

PRIOR ART

U.S. Pat. No. 5,549,851, to Fukushima et al., discloses conductive coatings with three constituents: an aryl amine charge transport molecule, polysilane binder, and an oxidant. However, it is known that polysilane binders decompose upon light exposure. It is also particularly difficult to prepare thick coating films of polysilanes, for example, about 30 micron. Representative coatings were found to be unstable electrically and mechanically under ambient condition, for example, ferric chloride doped coatings were very brittle with unstable conductivity.

U.S. Pat. No. 5,587,224, to Hsieh et al., discloses the use of photoacids as photooxidants for overcoating with two or three constituents.

The disclosures of each of the aforementioned patents are totally incorporated herein by reference.

There continues to be a need for conductive polymeric compositions and processes which provide coatings with wide range of stable and controlled conductivity.

There also remains a need for conductive polymeric compositions which are homogeneous and pinhole free.

There also remains a need for conductive polymeric compositions which are suitable for use in high speed printing systems.

Also, there has been sought an inexpensive, efficient and environmentally efficacious means for producing conductive polymeric compositions.

These needs and others solutions to the aforementioned problems are provided for in embodiments of the present invention and as illustrated herein.

SUMMARY OF THE INVENTION

Embodiments of the present invention, include:

overcoming, or minimizing deficiencies of prior art compositions and processes, by providing compositions with improved conductivity and stability properties;

providing conductive coatings with stable conductivity under a wide range of environmental conditions;

providing conductive coatings with controlled and reproducible conductivity in the range of 100.0 S/cm to $10^{-12}$ S/cm.

providing a homogeneous molecular conductive coatings with controlled conductivity that is not limited by percolation;

providing a simple manufacturing process for the conductive coatings;

providing a process with broad manufacturing latitude, such as compatibility with a wide range of solvents and polymer binders;

providing pinhole free conductive coatings with high dielectric strength;

providing conductive coatings with high mechanical stability and wear resistance;

providing conductive coatings with low surface energy;

providing conductive coatings that can protect metal substrates from oxidation or corrosion;

providing conductive coatings with controlled conductivity for the aforementioned semiconductor device applications;

The foregoing and other embodiments are accomplished in accordance with the present invention by providing conductive polymer compositions with an oxidized oligomer salt, an arylamine charge transport molecule, and a polymer binder. The foregoing embodiments can also be accomplished by providing conductive polymer compositions with an oxidized oligomer salt, and a polymer binder containing integral arylamine charge transport units.

The conductive polymeric compositions and processes thereof of the present invention, in embodiments, provide improved stability and a broad range of conductivities, manufacturing and compositional latitude, and dielectric strength.

Still other embodiments of the present invention include applying the aforementioned compositions and processes to high speed laser printing and related printing processes.

DETAILED DESCRIPTION OF THE INVENTION

In embodiments, the present invention provides a composition for use as conductive coatings comprising an oxidized oligomer salt, a charge transport molecule, and a polymer binder. The oxidized oligomer salt can be, for example, oxidized oligo-diarylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, and oligo-tetraselenafulvalene salts, oxidized oligo-metallocene salts, and the like compounds, and mixtures thereof. Preferred oxidized oligomer salts are those compounds which do not oxidize, for example, the charge transport molecule containing arylamine charge transport units. However, oxidized oligomers that can oxidize arylamine charge transport molecules or units are within the scope of the present invention. The conductivity of the conductive coatings, in embodiments, is for example, of from about $10^{-12}$ to about 100.0 S/cm and can be controlled by the concentration levels of the oxidized oligomer salt and the charge transport units contained charge transport molecules of the conductive coating compositions.

The oxidized oligo-diarylamine salt, in embodiments, can be of the formulas

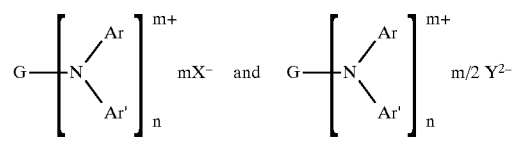

and mixtures thereof, wherein G is an aromatic group with from 6 to about 100 carbon atoms and connects to all the diarylamine groups, Ar and Ar' are substituted or unsubstituted aromatic groups with from 6 to about 18 carbon atoms, n is an integer from 2 to about 36, and in embodiments, preferably from 2 to 12, m is an integer which is equal or less than n, X⁻ is a monovalent counter anion such as $BF_4^-$, $PF_6^-$, $AsF_6^-$, $SbF_6^-$, $ClO_4^-$, $AuCl_4^-$, $C_{60}^-$, $I^-$, $Br_3^-$, $I_3^-$, $FeCl_4^-$, $SnCl_5^-$, $PO_3^-$, $(CF_3SO_3)_4Al^-$, $(CF_3SO_3)_4Ga^-$, $(CF_3SO_3)_4Ta^-$, $(CF_3SO_3)_4B^-$, trifluoroacetate, benzoate, nitrobenzoate, toluenesulfonate, p-bromobenzenesulfonate, p-nitrobenzenesulfonate, trifluoromethanesulfonate, nonafluorobutanesulfonate, 2,2,2-trifluoroethanesulfonate, tetraphenylborate, anionic tetracyanoquinodimethane, bis(trifluoromethanesulfonyl)imide, and mixtures thereof, $Y^{2-}$ is a divalent counter anion selected from the group consisting of $SiF_6^{2-}$, $GeF_6^{2-}$, $TiF_6^{2-}$, $TaF_7^{2-}$, $NbF_7^{2-}$, $RuCl_6^{2-}$, $OsCl_6^{2-}$, $IrCl_6^{2-}$, $PdCl_4^{2-}$, $PdCl_6^{2-}$, $PdI_4^{2-}$, $PtCl_4^{2-}$, $PtCl_6^{2-}$, $PtBr_6^{2-}$, $IrCl_6^{2-}$, $ZrF_6^{2-}$, benzenedisulfonate, $B_{12}H_{12}^{2-}$, $C_{60}^{2-}$ fullerenes and the like compounds, and mixtures thereof, reference also for example, N. G. Connelly and W. E. Geiger, "Chemical Redox Agents for Organometallic Chemistry", Chemical Reviews, 1996, 96, 877–910, the disclosure of which is totally incorporated herein by reference.

The oxidized oligo-diarylamine salt, in embodiments, can be diamine salts of the formulas

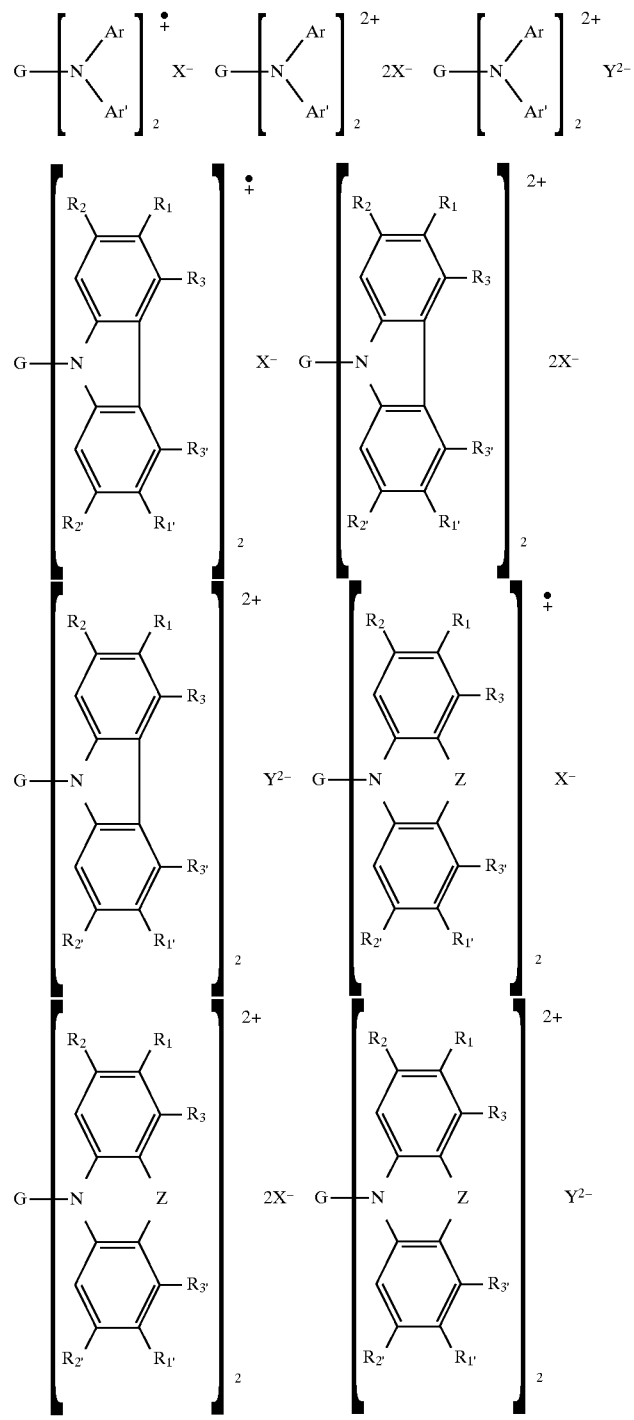

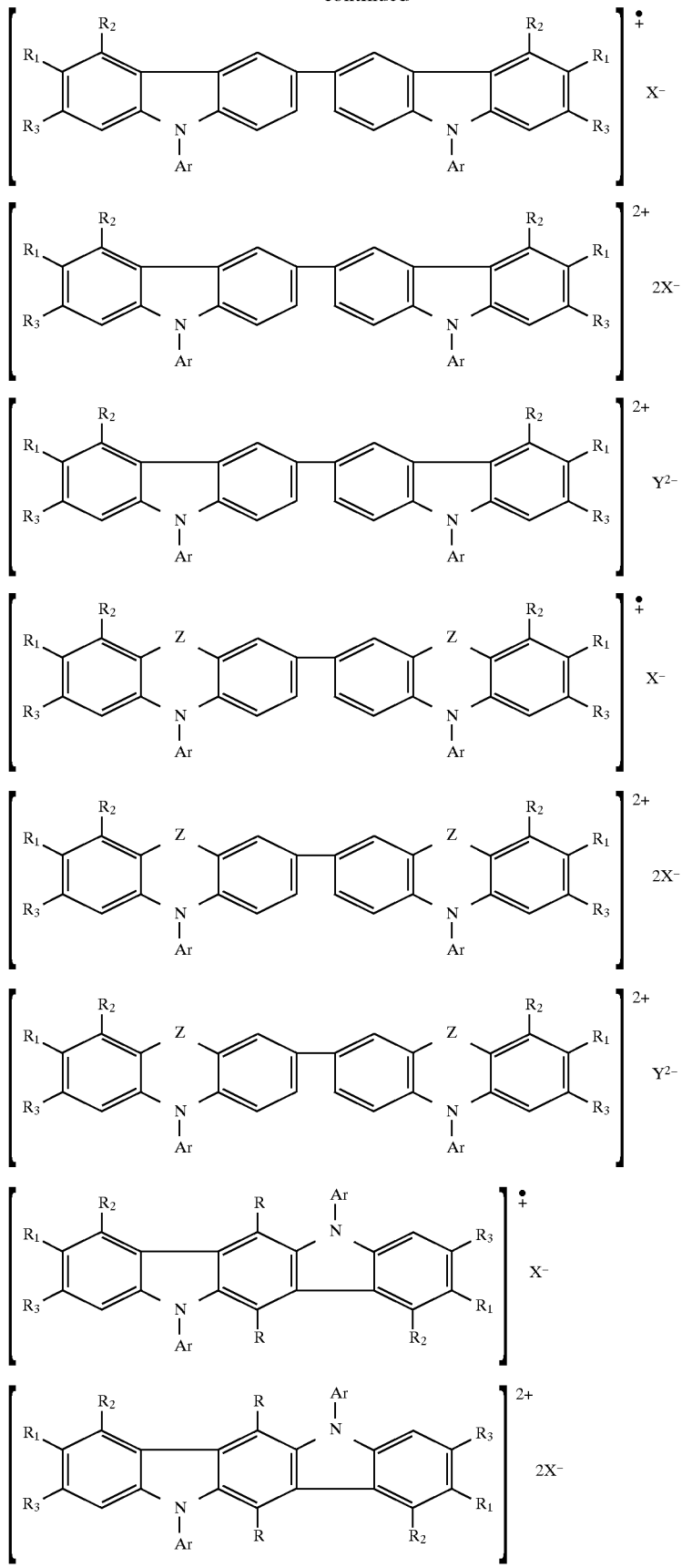

-continued

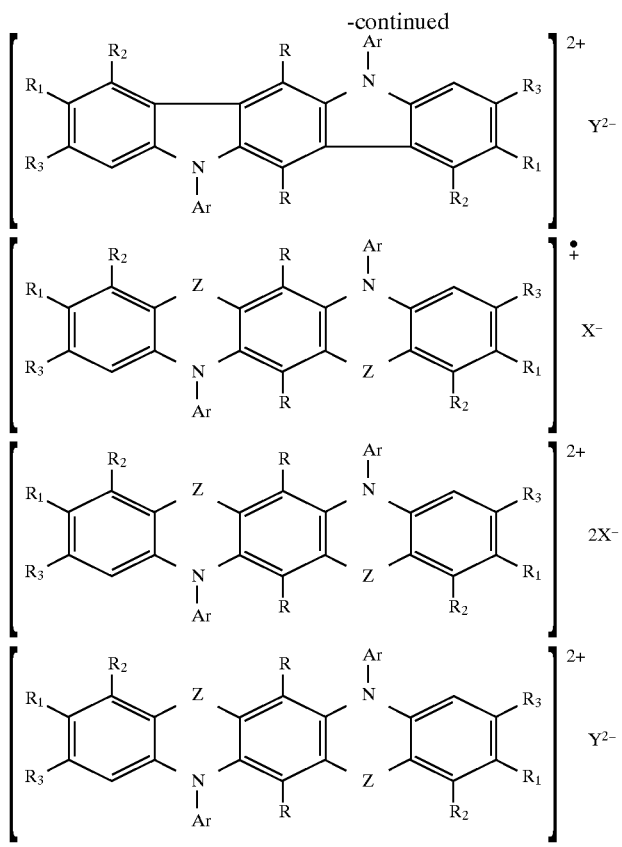

wherein Ar and Ar' are unsubstituted or substituted aromatic groups with from 6 to about 18 carbon atoms, such as, for example, phenyl, 3-methylphenyl, 4-methylphenyl, 3,4-dimethylphenyl, 4-ethylphenyl, 4-t-butylphenyl, 4-methoxyphenyl, 4-bromophenyl, 4-chlorophenyl, 3-iodophenyl, 4-flourophenyl, 4-phenylphenyl, 2-naphthyl, 1-naphthyl; R, $R_1$, $R_2$, $R_3$, $R_1'$, $R_2'$, and $R_3'$ are independently selected from hydrogen, bromine, chlorine, fluorine, alkyl groups containing from 1 to about 24 carbon atoms, and alkoxy groups containing from 1 to 24 carbon atoms; $X^-$ is monovalent counter anion as indicated above; $Y^{2-}$ is a divalent counter anion as indicated above; Z is selected from O, S, Se, and methylene —$CH_2$—, n is an integer from 1 to 4; G is an alkylene group with 1 to about 12 carbon atoms or of the formulas

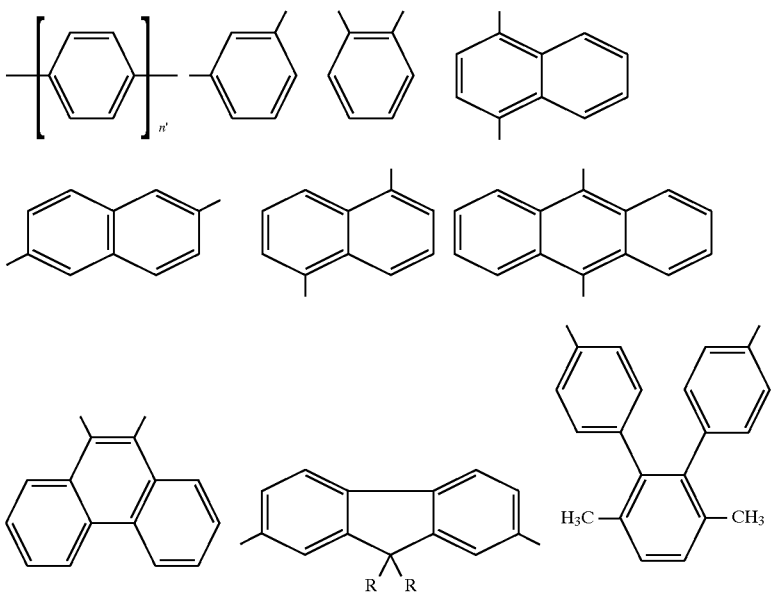

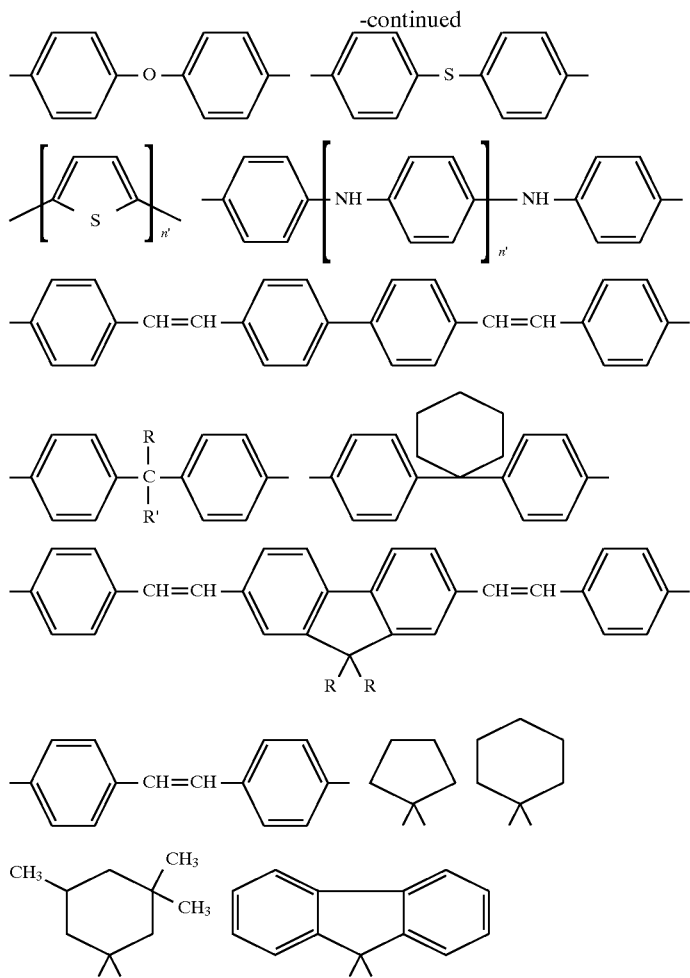

wherein n' is an integer from 1 to about 12, and wherein R and R' are alkyl groups with 1 to about 12 carbon atoms.

The oxidized oligo-diarylamine salt, in embodiments, preferably are of the formula wherein $R_1$, $R_2$, $R_3$, $R_1'$, $R_2'$, and $R_3'$ are independently selected from hydrogen, bromine, chlorine, fluorine, alkyl groups containing from 1 to about 24 carbon atoms, substituted and unsubstituted aromatic groups, and alkoxy groups with from 1 to about 12 carbon atoms, and $X^-$ is a monovalent counter anion. Particularly preferred oxidized oligo-diarylamine salts are tetratolyldiamine salts of the formula

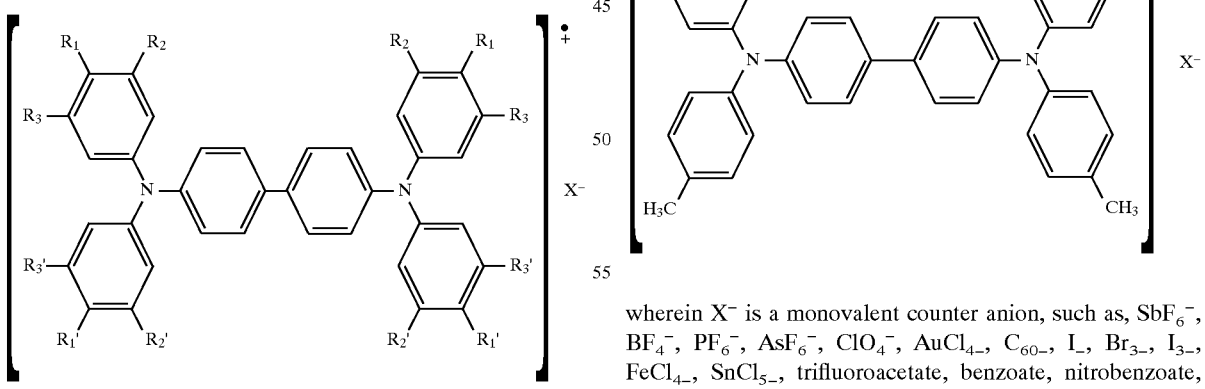

wherein $X^-$ is a monovalent counter anion, such as, $SbF_6^-$, $BF_4^-$, $PF_6^-$, $AsF_6^-$, $ClO_4^-$, $AuCl_4^-$, $C_{60-}$, $I_-$, $Br_{3-}$, $I_{3-}$, $FeCl_{4-}$, $SnCl_{5-}$, trifluoroacetate, benzoate, nitrobenzoate, toluenesulfonate, p-bromobenzenesulfonate, p-nitrobenzenesulfonate, trifluoromethanesulfonate, nonafluorobutanesulfonate, 2,2,2-trifluoroethane-sulfonate, mixtures thereof, and the like.

The oxidized oligo-diarylamine salts, in embodiments, can be triamine salts such as of the formulas

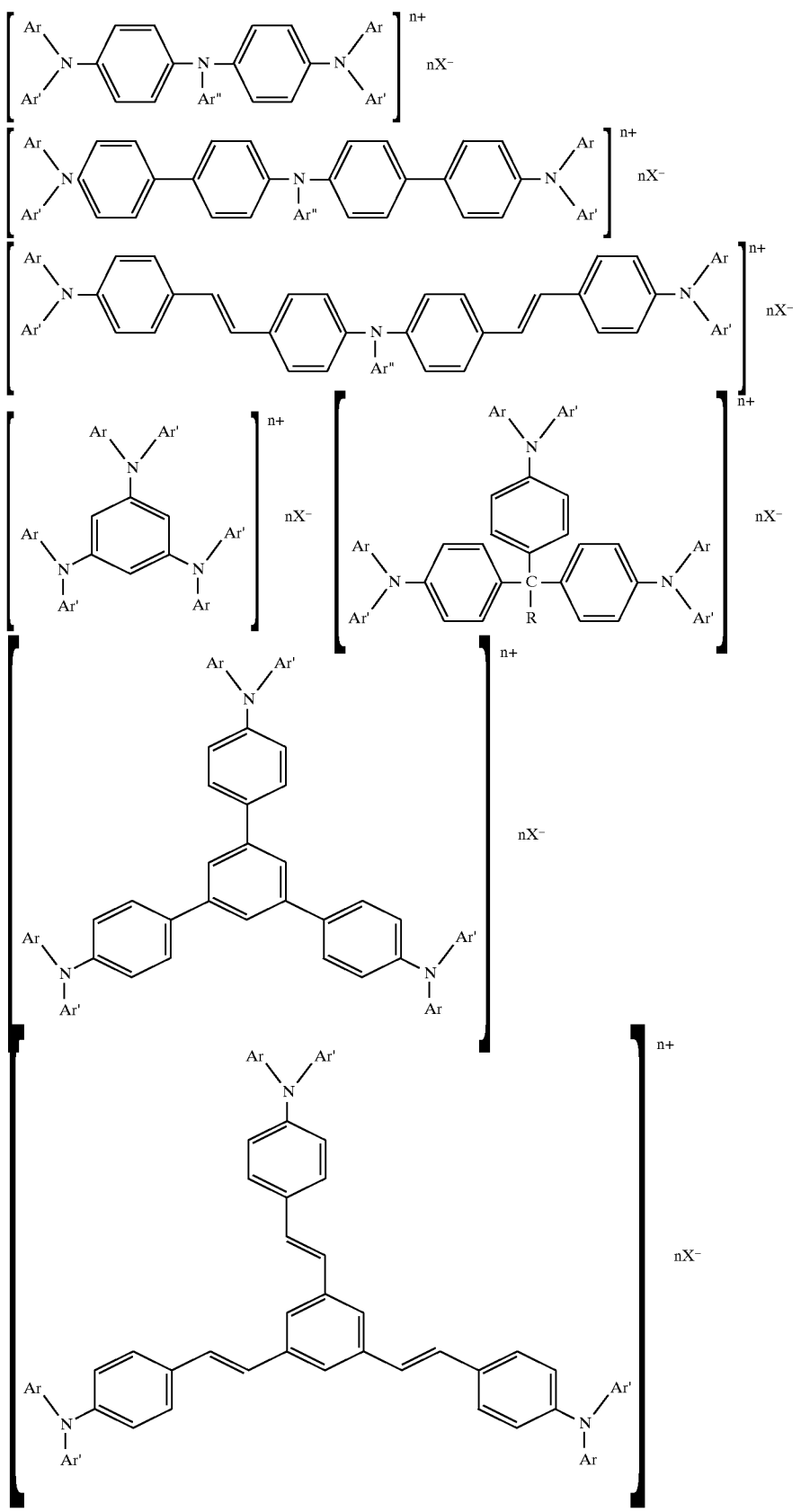

wherein Ar and Ar' are independently selected from substituted and unsubstituted aromatic groups, n is 1, 2, or 3, and X⁻ is a monovalent anion.
In embodiments, the oxidized oligo-diarylamine salts can be tetra-amine salts of the formulas
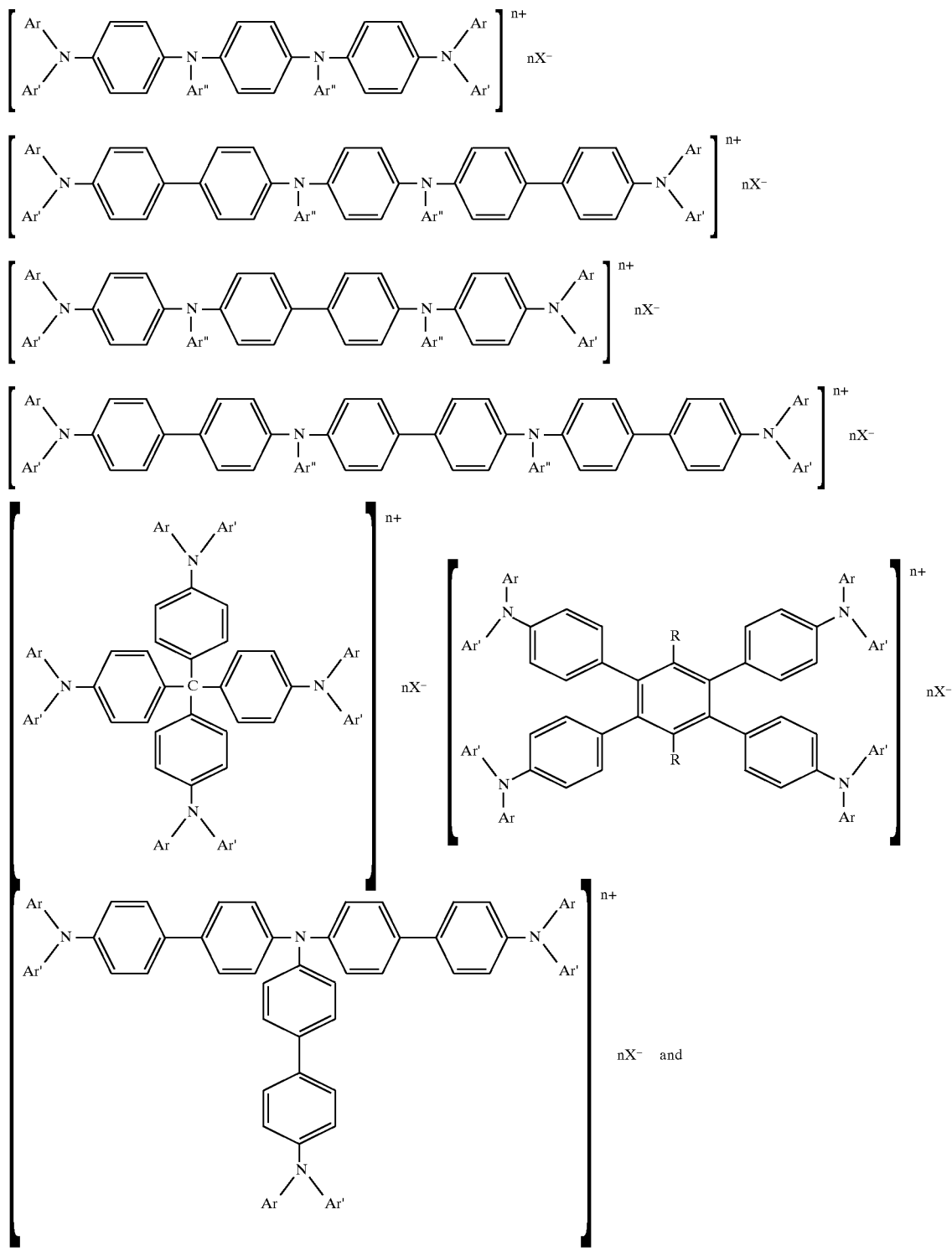

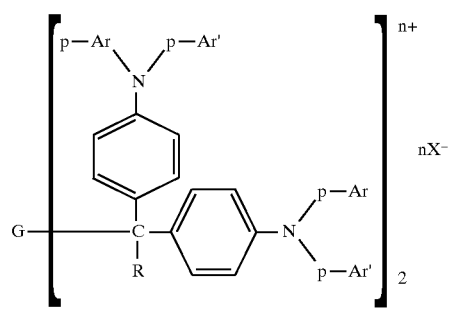
wherein Ar, Ar', and Ar" are substituted and unsubstituted aromatic groups, p-Ar and p-Ar' are para-substituted phenyl groups, n is 1 to 4, $X^-$ is a monovalent anion as indicated above, G can be of the formulas
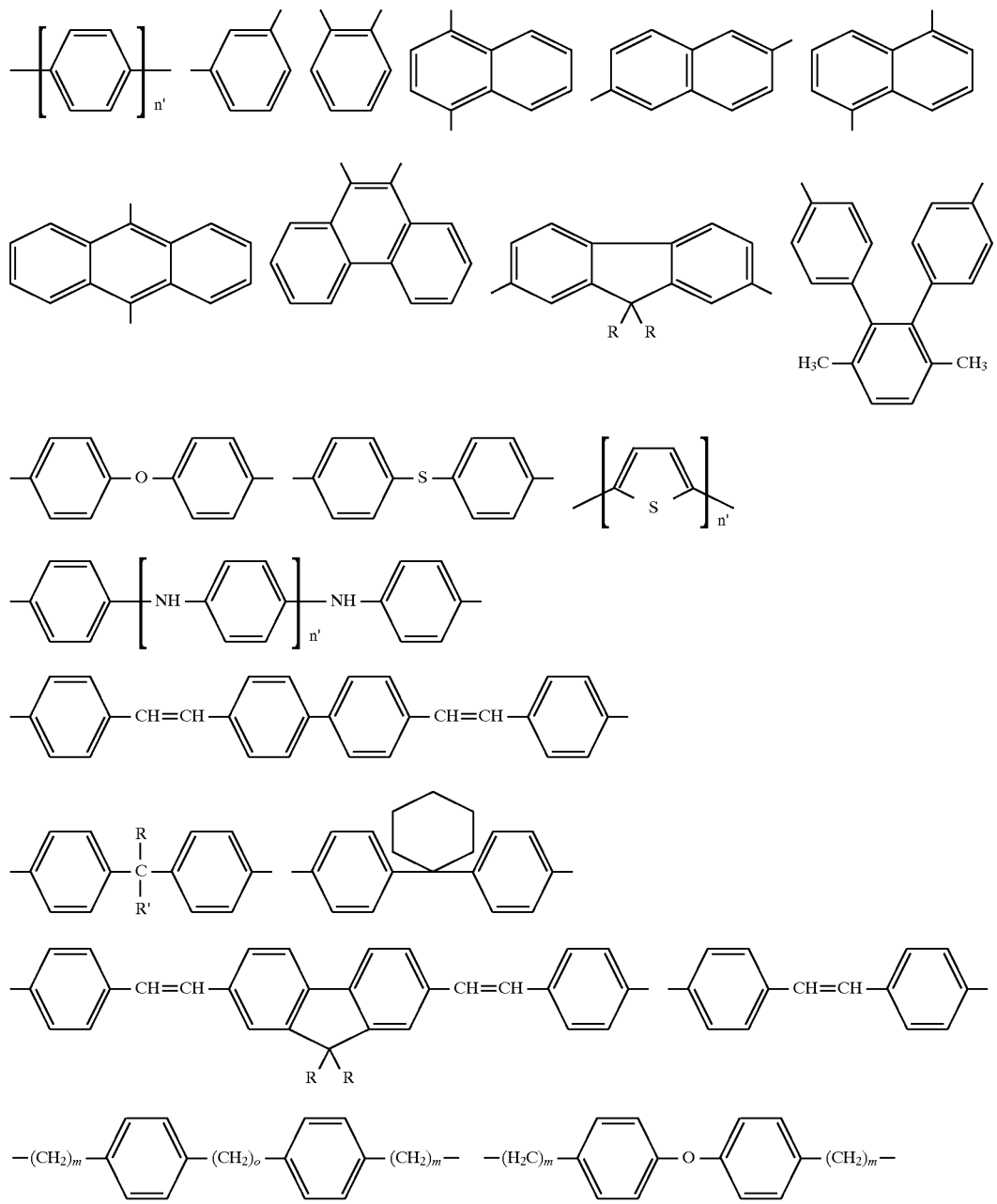

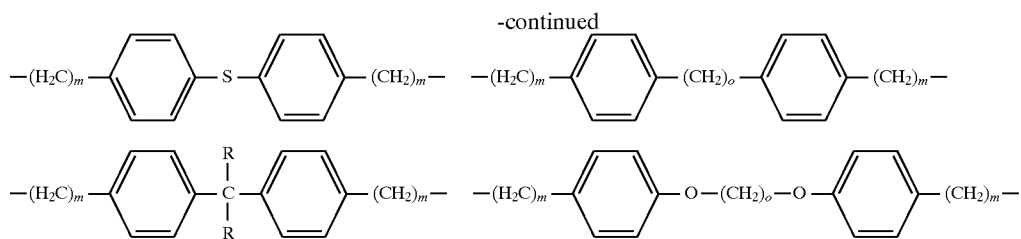

wherein n' is an integer from 1 to about 12; m and o are integers from 0 to about 12; R and R' are alkyl groups with 1 to about 12 carbon atoms.

In other embodiments, the oxidized oligo-diarylamine salts can be penta-amine salts of the formulas

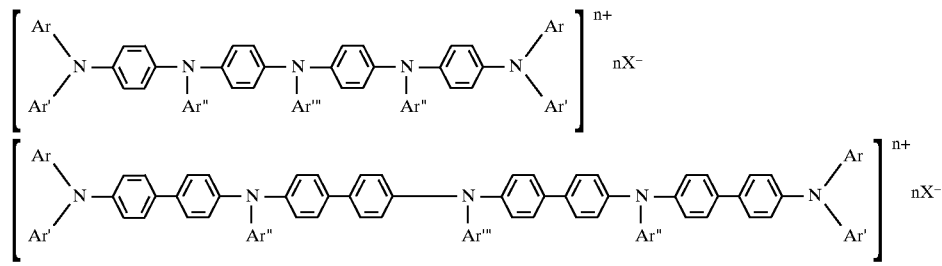

wherein Ar, Ar', Ar" and Ar'" are substituted and unsubstituted aromatic groups, n is an integer from 1 to 5, and X⁻ is a monovalent anion.

Alternatively, the oxidized oligo-diarylamine salts, in embodiments, can be hexa-amine salts, for example, of the formulas

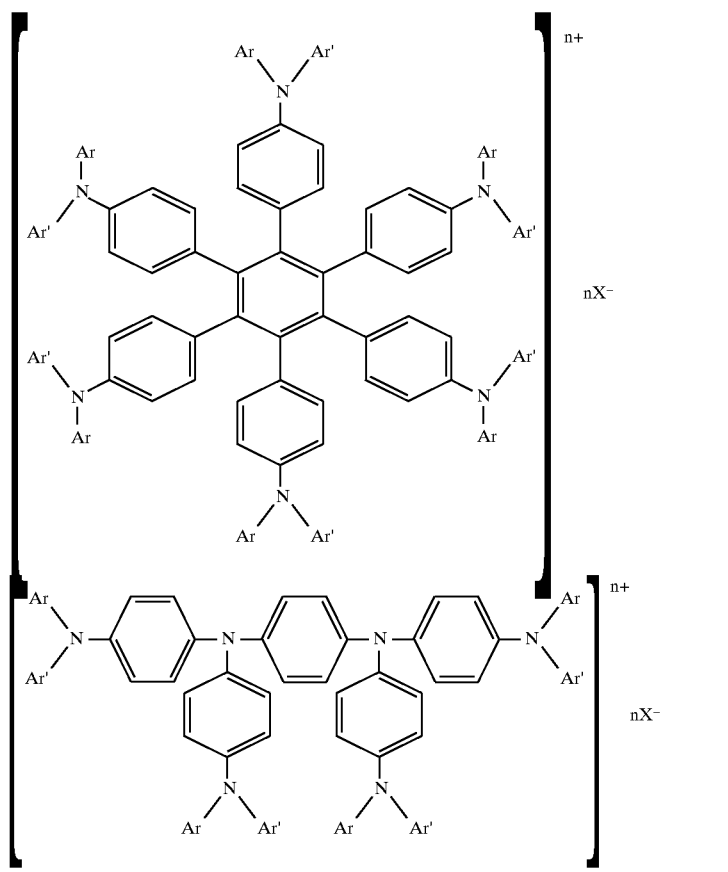

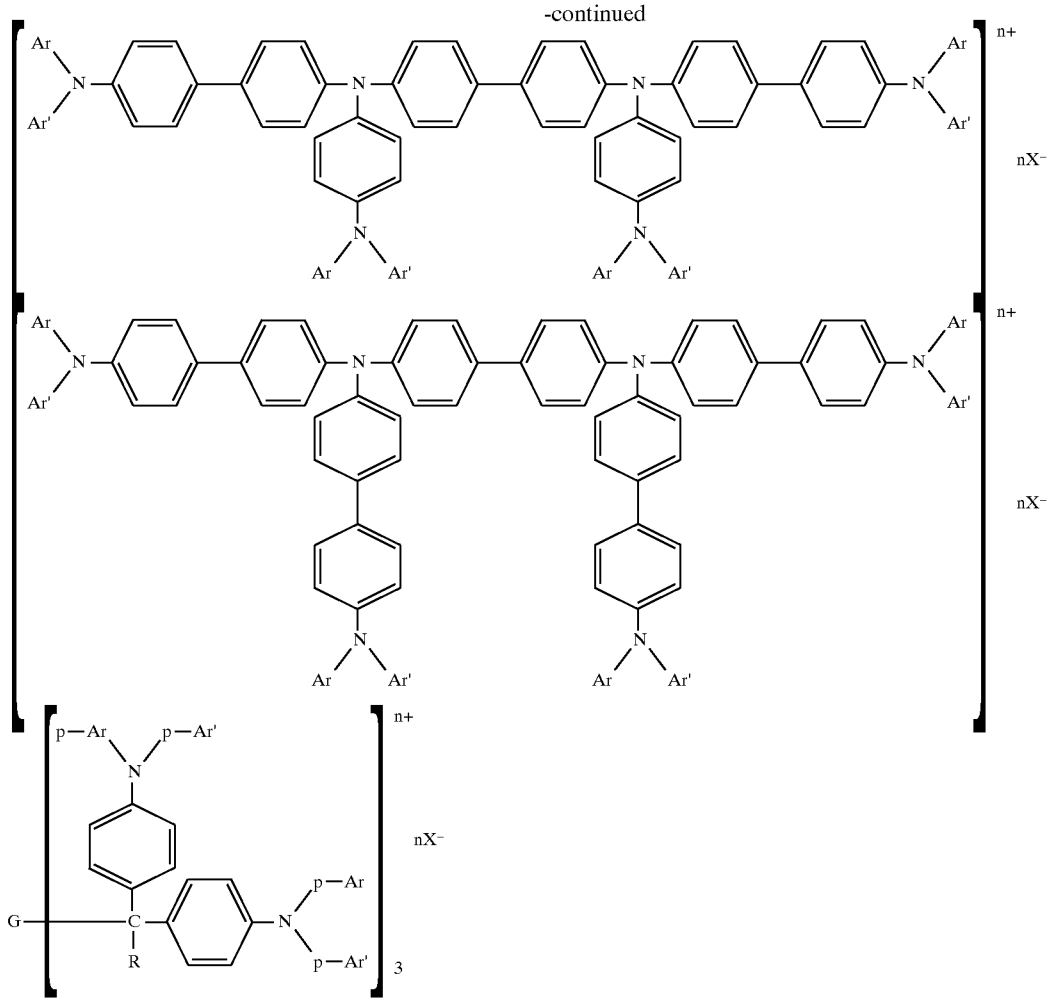
wherein Ar and Ar' are substituted aromatic groups with from 6 to about 25 carbon atoms and with substituents including alkyl, aryl, alkoxy, hydrogen, and halide as indicated above, p-Ar and p-Ar' are para-substituted phenyl groups, n is an integer from 1 to 6, $X^-$ is a monovalent anion as indicated above, G can be of the formulas
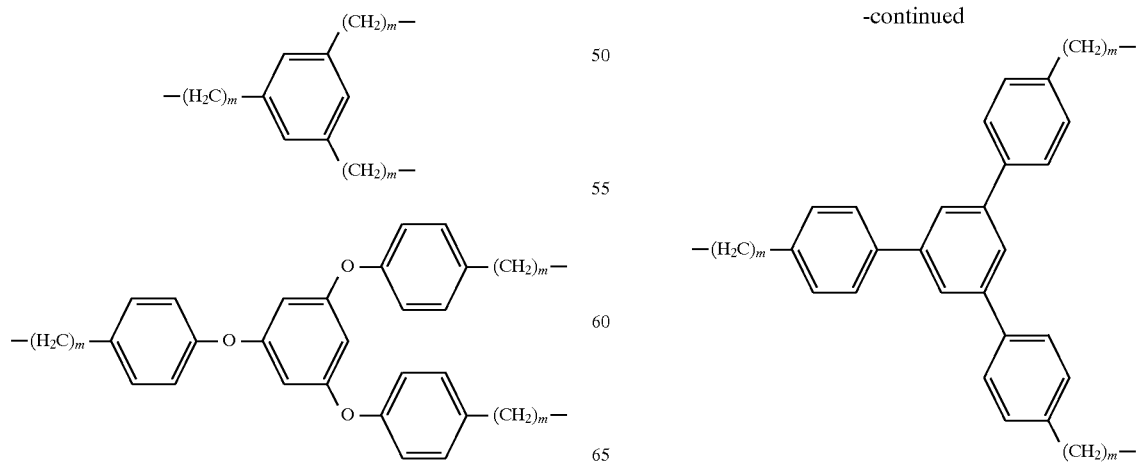

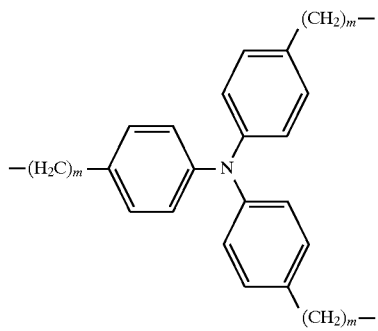

and wherein m is an integer from 0 to about 12.

The oxidized oligomer salts, in embodiments, can be oligo-thiophene salts, for example, of the formulas

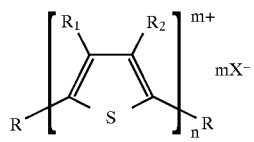

and

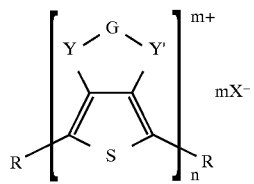

and wherein R, $R_1$ and $R_2$ are independently selected from hydrogen, alkyl, alkoxy, alkylthio groups containing from 1 to about 12 carbon atoms, n is an integer from 2 to about 12, m is an integer which is less than or equal to n, X is a monovalent anion as indicated above, Y and Y' are independently selected from O and S, and G is a substituted or unsubstituted alkylene group containing 1 to about 24 carbon atoms.

Oligo-aniline salts suitable as oxidized oligomeric salts, in embodiments, can be of the formula

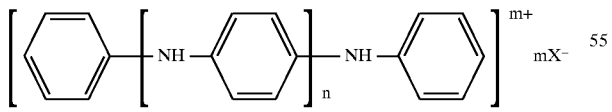

wherein n is an integer from 1 to about 12, m is an integer which is less than or equal to n+1, and X− is a monovalent anion;

In embodiments, oxidized oligomeric salts can be, for example, oxidized porphyrin salts of the formulas

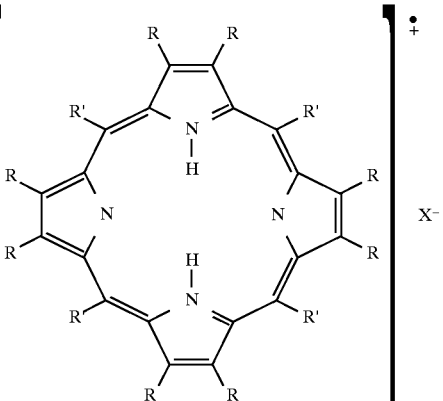

and

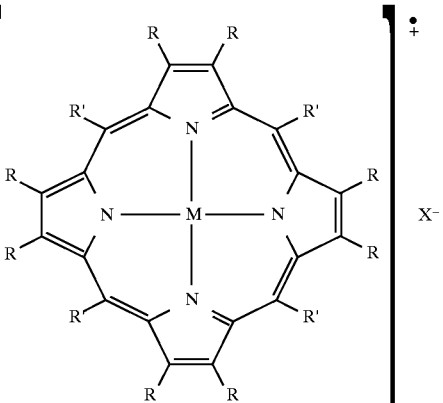

wherein R and R' are independently hydrogen, alkyl groups containing 1 to about 20 carbon atoms, and an aromatic group with from 6 to about 24 carbon atoms, and a heteroaryl group with form 5 to about 24 carbon atoms, M is a divalent metal ion, such as Cu(II), Zn(II), Fe(II), Co(II), and X− is a monovalent anion as indicated above.

The oxidized oligomeric salts, in embodiments can be, oxidized tetrathiotetracene salts and oxidized tetraselenotetracene salts which are radical cations, for example, of the formulas,

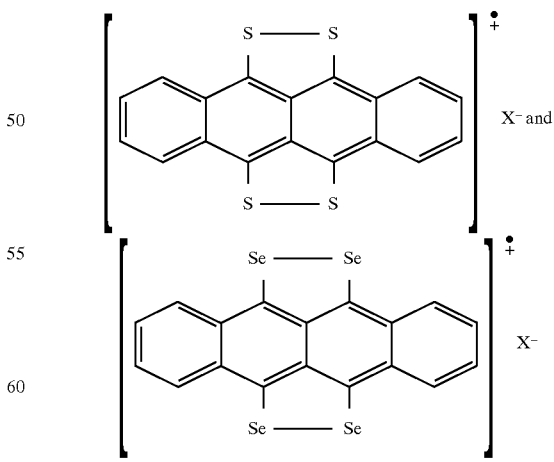

and wherein X− is a monovalent anion; or oligotetrathiafulvalene salts and oxidized oligotetraselenafulvalene salts, respectively, for example, of the formulas

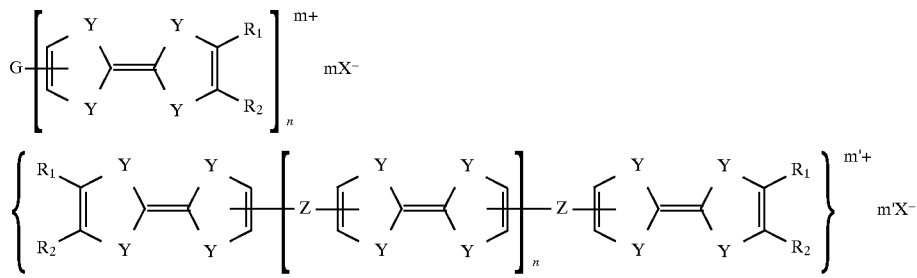

wherein G is nil or an n-valent aromatic group that connects all the fulvalene units, Y is S or Se, Z is nil or a divalent unsaturated group, n is an integer from 1 to 6, m is an integer which is less than or equal to n, m' is an integer which is less than or equal to n+2, $R_1$ and $R_2$ are independently selected from hydrogen, aryls with from 6 to about 24 carbon atoms, alkyl, alkoxy, or alkylthio groups with from 1 to 12 carbon atoms, and $X^-$ is a monovalent anion as indicated above; and oxidized oligo-metallocene salts of the formula

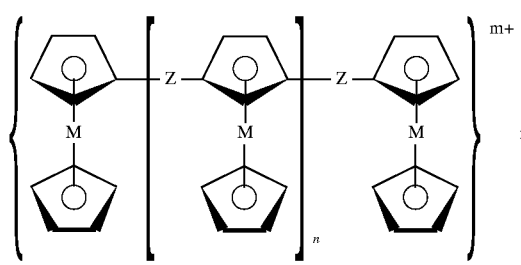

wherein M is a divalent metal, such as Fe(II) and Co(II), Z can be, for example, nil, methylene, ethylene, $Si(CH_3)_2$, $Si(CH_3)Ph$, $Ge(CH_3)_2$, or phenylene, n is an integer from 1 to about 12, m is an integer which is less than or equal to n+2, and $X^-$ is a monovalent anion as indicated above.

The charge transport component can be, in embodiments, for example, N,N,N-triarylamine containing compounds, carbazole compounds, oligothiophene compounds, carbon 60 compounds and related fullerene compounds, and mixtures thereof. Preferred N,N,N-triarylamine containing compounds are of the formula

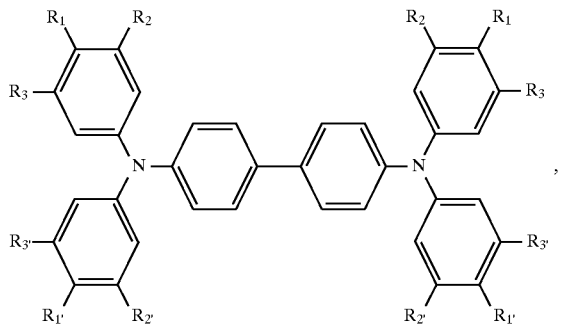

wherein $R_1$, $R_2$, $R_3$, $R_1'$, $R_2'$, $R_3'$ are independently hydrogen, bromine, chlorine, fluorine, alkyl groups containing from 1 to about 24 carbon atoms, substituted and unsubstituted aromatic groups, and alkoxy groups with 1 to about 12 carbon atoms.

The polymer binder can include but are not limited to, for example, polyvinylcarbazoles, polythiophenes, polysilanes, polyanilines, poly(phenylene vinylenes), polyphenylenes, poly(phenylene sulfides), polyanilines, poly(phenylene sulfide phenylenamine), and polymers containing triarylamine charge transport units such as illustrated in the formula

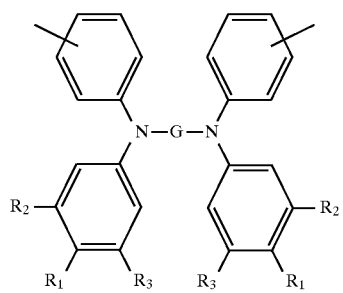

wherein $R_1$, $R_2$ and $R_3$ are independently hydrogen, bromine, chlorine, fluorine, alkyl groups containing from 1 to about 24 carbon atoms, substituted and unsubstituted aromatic groups, and alkoxy groups containing from 1 to about 24 carbon atoms; G is selected from alkylene groups of 1 to about 12 carbon atoms and the following formulae:

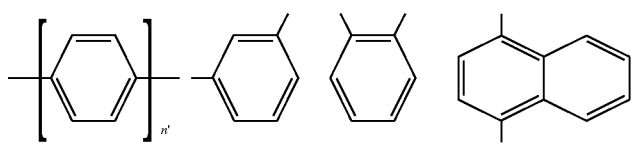

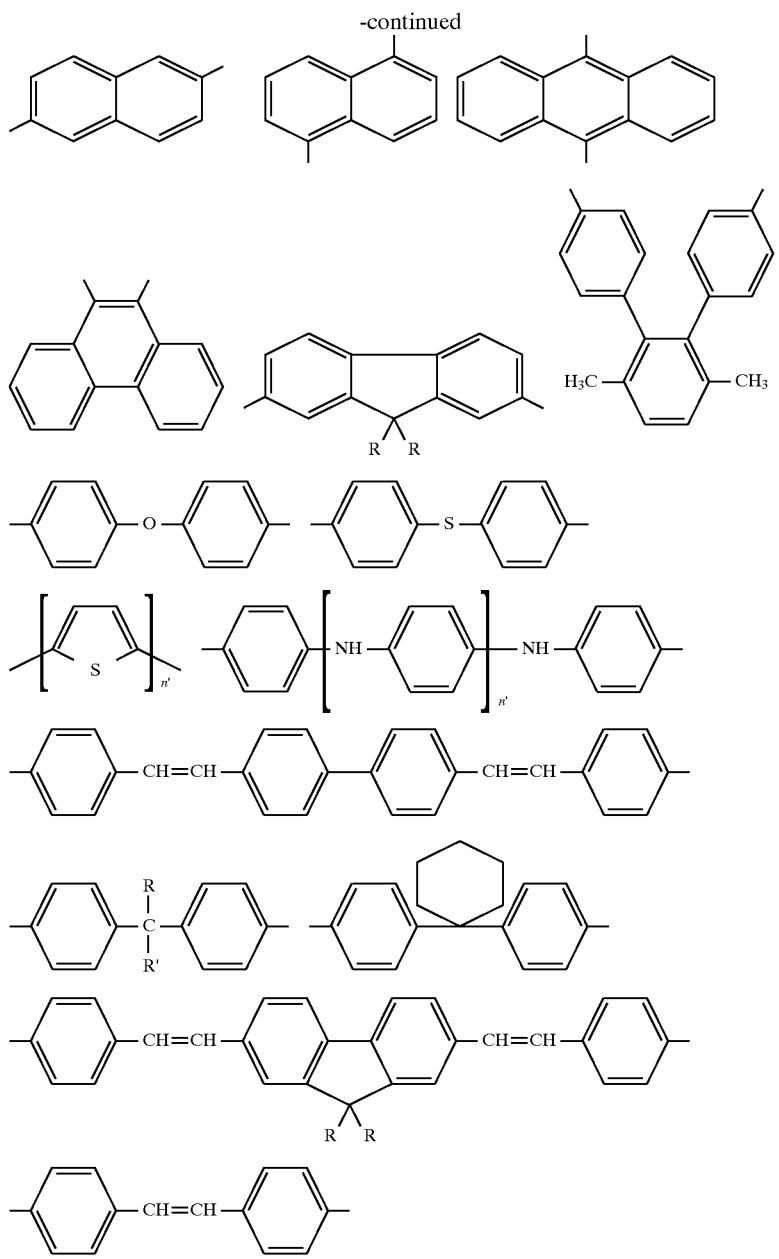

wherein n' is an integer from 1 to about 12; R and R' are alkyl groups with 1 to about 12 carbon atoms.

The polymer binder, in embodiments, can be, for example, solvent processable and melt processable thermoplastics and elastomeric resins. The inert polymers suitable as polymer binders can include but are not limited to thermoplastics and elastomerics such as polystyrenes, polycarbonates, polyesters, polyimides, polyurethanes, polysulfones, polyethersulfones, polyether ketones, polyamides, and the like materials, and copolymers and polymer blends thereof.

In embodiments, the weight percent ratio of the oxidized oligomer salt to the charge transport compound is of from about 0.01:99.99 to about 99.99:0.01, and the weight percent ratio of the oxidized oligomer salt plus the charge transport compound to the polymer binder is of from about 10:90 to 90:10.

The conductive polymeric compositions of the present invention, in embodiments can have, for example, coatings with a conductivity of from about $10^{-12}$ to about 1.0 S/cm, and wherein the conductivity depends on the loading levels of the charge transport compound and the oxidized oligomer salt, reference for example the working examples, particularly Example V.

In embodiments, the present invention provides a process for the fabrication of conductive polymer coatings comprising:

preparing an oxidized oligomer salt;

admixing the oxidized oligomer salt with a charge transport molecule and a polymer binder in a solvent to give a coating solution; and depositing conductive coatings from the coating solution on a substrate.

The substrate can have a thickness of from about 50 microns to about 1,000 microns, and wherein the conductive coating layer has a thickness of from 0.1 to about 5.0 microns. The solids concentration of the coating solution can be of from about 0.1 to about 50 weight percent. The coatings can be deposited on the substrate by conventional means, for example, spin coating, spray coating, dip coating, and flow coating from a solution of an oxidized oligoarylamine salt, a charge transport molecule and a polymer binder dissolved in organic solvents:

The oxidized oligomer salts can be prepared by chemical oxidation with an oxidant or electrochemical oxidation of an oligomer, reference for example, working Examples II and III herein. In embodiments, oxidants for chemical oxidation of the oligomeric salts are ionic salts, Brønsted acids, and Lewis acids. Ionic salts include $AgSbF_6$, $AgAsF_6$, $AgPF_6$, $AgBF_4$, AgBr, AgI, AgF, AgCl, $O_2SbF_6$, $O_2AsF_6$, $NOSbF_6$ and $NOAsF_6$, $(CH_3CH_2)O^+(CF_3SO_3)Al^-$, $(CH_3CH_2)O^+(CF_3SO_3)Ga^-$, $(CH_3CH_2)O^+(CF_3SO_3)B^-$, $CH_3(C=O)^+(CF_3SO_3)Al^-$, and the like compounds. Brønsted acids include sulfonic acids, phosphoric acids, carboxylic acids, and the like compounds. Lewis acids include $AlCl_3$, $GaCl_3$, $SnCl_4$, $BF_3$, $FeCl_3$, $AsF_3$, $SnCl_4$, $ZrCl_4$, $ZnCl_2$, $TiCl_4$, $AuCl_3$, $CuCl_2$, $VCl_3$, $InCl_3$, $TaCl_5$, $SbF_5$, and the like compounds.

The invention will further be illustrated in the following non limiting Examples, it being understood that these Examples are intended to be illustrative only and that the invention is not intended to be limited to the materials, conditions, process parameters, and the like, recited herein. Parts and percentages are by weight unless otherwise indicated.

EXAMPLE I

Preparation of N, N, N', N'-tetra-ptolyl-biphenyidiamine (TM-TPD):

Synthesis of 4'-methyacetanilide: Into three neck round bottom flask (5 L) equipped with a mechanical stirrer, a condenser, and an addition funnel, were added p-toluidine (995 grams, 9.3 mol) and hexanes (1.6 L). Acetic anhydride (960 mL, 10.2 mol) was added dropwise for 2 hour enough to reflux. Then it was refluxed for 1 hour and cooled to room temperature to give a brown solid. This was collected by suction filtration, transferred into a beaker, and washed with water (2 L) for 30 minutes. The filtration and washing procedures were repeated. The wet white crystals was air dried for 7 days to N-(4-Methylphenyl)acetamide (1,343 g, 97% yield). Melting point: 150–152° C. (Lit. 153° C., Merck Index 11, 67).

Synthesis of N,N-p,p'-Ditolylamine: To a round bottom flask (3 L) equipped with a condenser a Dean-Stark trap, a mechanical stirrer, and an argon-outlet with a thermometer, was added 4'-methylacetanilide (448 g, 3.0 mol), 4-iodotoluene (746 g, 3.4 mol, from Aldrich), potassium carbonate (830 g, 6.0 mol), copper sulfate (20 g), and toluene (50 mL). The reaction mixture was heated at 210° C. for 24 h in an oil bath. The resulting solution was decanted to a round bottom flask (5 L) and the remaining solid was washed with hot ethanol (3×500 mL). To the combined mixtures, were added potassium hydroxide (340 g) and water (400 mL) and were refluxed for 24 h. To resulting solution, a concentrated HCl (400 mL) was added dropwise followed by toluene (1000 mL). The mixture was refluxed for 10 min. The hot organic layer (top) was separated, washed with a hot water (500 mL×2), and concentrated under reduced pressure. The resulting solid was recrystalized from the mixture of toluene (100 mL) and hexanes (700 mL). The obtained wet crystals was ground with a mortar and pestle, filtered, washed with hexanes (100 mL), and dried in air for 1 day to give brown crystals (360 g, 6 mol). The filtrate was concentrated under reduced pressure and recrystalized from the mixture of toluene (20 mL) and hexanes (150 mL) to give a brown solid (120 g, second crop). The combined solid was distilled at 165° C. and 1 Torr to give a white solid (445 g) while the first portion (15 g, distilled at 65°–80° C. and 1 Torr) was discarded. The white solid was recrystalized from hexanes (500 mL) to give a white solid (422 g, 71% yield). Melting point: 80–82° C. (lit. 79 oC, TCl catalog ) $^1$H-NMR ($CDCl_3$): 7.04 (d, 4H), 6.93 (d, 4H), 5.45 (s, br, 1H), 2.33 (s, 6H ) ppm. Note that when iodotoluenes from Oakwood Product Inc. or Charkit Chemical Inc. were used, the reaction was very slow. Three portions of $CuSO_4$ (50 g) were added every 10 h and the reaction was completed in 40 h (over 95% conversion of 4'-methylacetanilide). During work-up after hydrolysis, suction filtration was required to remove copper residues.

Synthesis of N,N,N'N'-tetra-p-tolylphenyldiamine (TM-TPD): To a round bottom flask (5 L) equipped with a condenser a Dean-Stark trap, a mechanical stirrer, and an argon-outlet with a thermometer, was added 4,4'-diiodobyphenyl (DIB, 406 g, 1.0 mol), N,N-di-p-tolylamine (417 g, 2.1 mol), potassium hydroxide (448 g, 8.0 mol), and toluene (300 mL). After adding 1,10-phenanthroline (9.0 g) and CuCl (1.5 g) at 130° C., the mixture was vigorously refluxed at 137° C. After adding another portion of CuCl (3.5 g), a very severe exotherm was observed. The reaction mixture was further heated at 130° C. for 4 h. To the reaction mixture, was added water (400 mL), toluene (400 mL), and acetic acid (400 mL). The resulting solution was washed with water (2 L) by gentle swirling in a 6 L separatory funnel and top layer was collected. The aqueous layer was suction-filtered and residue was washed with toluene (300 mL) and top layer was separated. After combining organic solutions, the washing process was repeated once. The dark organic solution was concentrated in a reduced pressure and the resulting solution was chilled in freezer for 1 h to yield a brown solid. After filtering, the brown solid was washed with acetone (3×400 mL) and dried in oven at 45° C. and 10 Torr. To a round bottom flask (2 L) equipped with a condenser, a mechanical stirrer, an argon-outlet with a thermometer and heating mantle were charged the crude product (350 g) and a neutral alumina (200 g) and toluene (1 L). The mixture was heated at 90° C. for 2.5 h. The resulting yellow solution was filtered through a preheated Buchner funnel. The remaining alumina was extracted with a hot toluene (350 mL×2). After concentrating the combined yellow solution in vacuo, the resulting pale yellow solid (350 g) and acetone (400 g) was heated at 60° C. and stirred at 23° C. for 15 h under argon to give a pale yellow solid. After filtering, washing with acetone (200 mL×3), and drying in a reduced pressure overnight, a pure TM-TPD (306 g, 56% yield) was obtained. Melting point: 217°–219° C.; $^1$H-NMR ($CDCl_3$): 7.39 (d, 4H), 7.07–7.00 (m, 20H), 2.31 (s, 12H) ppm.

EXAMPLE II

Preparation of Oxidized N,N,N', N'-tetra-p-tolyl-4,4'-biphenyldiamine (TM-TPD) salts:

Synthesis of $SbF_6$ salt: To a one neck flask (1 l) equipped with a magnetic stirrer, were added TM-TPD (60.0 g, 0.11 mol) and dichloromethane (250 mL). To this solution, the solution of $AgSbF_6$ (34.4 g, 0.10 mol) in dichloromethane (250 mL) was added dropwise for 2 h, the same reaction as in Example I above except charging TM-TPD, $AgSbF_6$, and dichloromethane, gave an impure product containing dication complex. The resulting brown solution was filtered and the silver residue was rinsed with dichloromethane (50 mL). To the combined dichloromethane solution, hexanes (1500 mL) was slowly added for 1 h to give a blue solid (note that rapid addition of hexanes to dichloromethane solution gave an impure product containing TM-TPD). After filtering and drying at 40° C. and 15 Torr for 1 day a blue solid (76.8 g, 98.5% yield) was obtained. UV spectrum: 281, 362, 491 nm, mass spectrum (ESI/MS): M/Z 544.4+.

Synthesis of AsF$_6$ salt: To a three neck flask (1 l) equipped with a magnetic stirrer, an addition funnel and argon inlet, were added TM-TPD (11.44 g, 0.021 mol) and dichloromethane (50 mL). A solution of AgAsF$_6$ (5.94 g) in methylene chloride (50 mL) was stirred for 5 min and then filtered to give a clear solution. This was transferred into the addition funnel and added dropwise into the TM-TPD solution over 10 min. The resulting brown solution was filtered and the silver residue was rinsed with dichloromethane (50 mL). To the combined dichloromethane solution, hexanes (300 mL) was slowly added for 30 min to give a blue solid (fast addition of hexanes to dichloromethane solution gave an impure product containing TM-TPD). After stirring for 10 min, the dark blue precipitate was collected by suction filtration and dried in air for 2 days to give a blue solid, 13.3 g, 90% yield.

Synthesis of AuCl$_4$ salt: To a three neck flask (250 mL) equipped with a magnetic stirrer, were added TM-TPD (4.9 g, 0.009 mol), AuCl$_3$ (3.64 g, 0.012 mol) and dichloromethane (85 mL). The reaction mixture was stirred for 18 h. The dark solution was filtered and the residue was extracted with methylene chloride (100 mL×4). The solution was concentrated to about 200 mL and then added through filter paper into stirring hexanes (200 mL) to give a golden solid upon air dried (3.2 g). The collected solid was dissolved in methylene chloride (100 mL) and then poured into stirring hexanes (200 mL). The precipitate was collected by suction filtration and air dried to give a dark gold solid, 2.9 g, in 77% yield.

Synthesis of CF$_3$COO salt: To a single neck flask (250 mL) equipped with a magnetic stirrer, were added TM-TPD (5.40 g, 0.01 mol) and dichloromethane (25 mL). To this solution, the solution of CF$_3$COOAg (2.2 g) in dichloromethane (50 mL) was added dropwise. The resulting brown solution was stirred for 30 min and filtered. The filtrate was concentrated and the residue was dried in vacuum to give a dark blue solid (3.4 g).

EXAMPLE III

This example illustrates a typical procedure for the fabrication of the conductive coatings of the present invention. MYLAR® (75 microns) substrates with titanium coatings of about 200 to 300 Angstroms were from ICI. Substrates were overcoated with a silane blocking layer (200 to 500 Angstroms derived from 2-aminoisopropyltriehoxylsilane) and then an adhesive layer (200 to 500 Angstroms) of 49K polyester (from DuPont). The resulting substrates were used for depositing the conductive coatings using a Gardner mechanical driven film applicator which is enclosed in a plexiglass acrylic box with an attached cover. A substrate was placed on the vacuum plate of the Gardner coater and a size 0.004 Bird film applicator was placed on top of the substrate then coated with a conductive polymer layer using a solution prepared as follows: a mixture of N,N'-diphenyl-N,N'-di(m-tolyl)-[1,1'-biphenyl]-4,4'-diamine referred to as m-TPD hereinafter (4.0 g), MAKROLON® (7.44 g), TM-TPD·SbF$_6$(0.08 g) and methylene chloride (68 g) in an amber bottle was roll milled until complete solubilization of the solid occurred to give a coating solution with the following solid weight percents: MAKROLON (65%), m-TPD (35%) and TM-TPD·SbF$_6$ (2% with respect to m-TPD. The resulting coating was air dried for 1 h and then dried in a forced air oven at 125° C. for 30 min to give a coating with about 20–25 microns thick. This sample corresponds to sample #4 in Table 1. An Electrodag electrode was painted on the sample for charge relaxation time measurement which involved applying a pulsed voltage to the sample between electrodes. It is known that to the charge relaxation time constant is inversely proportional to the conductivity. Table 1 shows a series of coatings with different compositions and the corresponding initial charge relaxation time constant. All the samples were stress tested in an environmental chamber of 85% relative humidity (RH) and 50° C. The time constants of the samples were measured at different time intervals to determine the electrical stability of the coatings. As shown in Table 1, samples 1–3 that have the monomeric tritolylamine (TTA) salts are highly unstable and become 5 to 10 times more insulative than the as coated samples after 1 week under high RH. By contrast, samples 4, 5 and 6 which have the dimeric TM-TPD SbF$_6$ salt are extremely stable for more than 8 weeks.

TABLE 1

Comparative stability of oxidized transport layers

| Sample NO. | Solid Composition: polymer binder/charge transport compound/oxidized salt (% by weight) | Charge relaxation time constant (millisecond) | | | | | | | |
|---|---|---|---|---|---|---|---|---|---|
| | | As coated | 2 days | 1 wk | 2 wk | 4 wk | 6 wk | 7 wk | 8 wk |
| 1 | MAKROLON (65%)/m-TPD(35%)/ TTA.SbCl$_6$(5% with respect to m-TPD) | 0.43 | 0.88 | 4.50 | — | — | — | — | — |
| 2 | MAKROLON (65%)/m-TPD(35%)/ TTA.SbF$_6$(5% with respect to m-TPD) | 0.36 | 0.72 | 2.20 | — | — | — | — | — |
| 3 | MAKROLON (65%)/m-TPD(35%)/ TTA.AsF$_6$(5% with respect to m-TPD) | 0.60 | 0.90 | 3.67 | — | — | — | — | — |
| 4 | MAKROLON (65%)/m-TPD(35%)/ TPD-SbF$_6$(5% with respect to m-TPD) | 0.70 | — | 0.37 | 0.26 | 0.22 | 0.22 | 0.23 | 0.27 |
| 5 | MAKROLON (70%)/m-TPD(40%)/ TPD.SbF$_6$(5% with respect to m-TPD) | 0.55 | — | 0.31 | 0.28 | 0.30 | 0.32 | 0.30 | 0.33 |
| 6 | MAKROLON (70%)/m-TPD(40%)/ TPD.SbF$_6$(2% with respect to m-TPD) | 0.70 | — | 0.70 | 0.45 | 0.49 | 0.37 | 0.46 | 0.46 |

EXAMPLE IV

The samples shown in Table 2 are conductive coatings using TM-TPD as the charge transport compound, TM-TPD SbF$_6$ as the oxidized charge transport salt, and MAKROLON as the polymer binder. Highly stable charge relaxation times implying highly stable conductivity are observed for these samples.

TABLE 2

Conductive Coatings with High Degree of Electrical Stability

| Sample NO. | Solid Composition: polymer binder/charge transport compound/oxidized salt (% by weight) | Charge relaxation time constant (millisecond) | | | | | | | |
|---|---|---|---|---|---|---|---|---|---|
| | | As coated | 1 wk | 2 wk | 4 wk | 5 wk | 6 wk | 7 wk | 8 wk |
| 7 | MAKROLON (60%)/TM-TPD(40%)/ TM-TPD.SbF$_6$(2% with respect to TM-TPD) | 0.16 | 0.14 | 0.14 | 0.12 | 0.14 | 0.14 | 0.13 | 0.14 |
| 8 | MAKROLON (60%)/TM-TPD(40%)/ TM-TPD.SbF$_6$(5% with respect to TM-TPD) | 0.05 | 0.04 | 0.02 | 0.03 | 0.03 | 0.03 | 0.02 | 0.03 |
| 9 | MAKROLON (70%)/TM-TPD(30%)/ TM-TPD.SbF$_6$(2% with respect to TM-TPD) | 0.41 | 0.24 | 0.23 | 0.24 | 0.22 | 0.20 | 0.23 | 0.22 |

EXAMPLE V

This example illustrates the conductivity control by adjusting the loadings of the oxidized oligomeric salts (TM-TPD SbF$_6$, molecular weight: 780.48) and the charge transport compound (TM-TPD, molecular weight: 544.69). As can be seen from tables 3 and 4, the conductivity of the coatings increases almost linearly with respect to the molar % of TM-TPD SbF$_6$ and then reaches plateaus at 50/50 TM-TPD SbF$_6$/TM-TPD. The conductivity of 2.78M doped coatings, Table 4, is about one order of magnitude higher that for the 1.22M doped coatings, Table 3, wherein M stands for molarity of TM-TPD SbF$_6$/TM-TPD+TM-TPD per kilogram of binder polymer.

TABLE 3

Conductivity in Coatings Doped with 1.22 M of TM-TPD.SbF$_6$ + TM-TPD

| Sample NO. | MAKROLON/ CH$_2$Cl$_2$ weights (g/g) | TM-TPD.SbF$_6$ Weight (g) | TM-TPD Weight (g) | Molar % of TM-TPD.SbF$_6$/ TM-TPD | Conductivity (S/cm) |
|---|---|---|---|---|---|
| 10 | 1.50/15.0 | 0.03 | 0.98 | 2/98 | $4.50 \times 10^{-9}$ |
| 11 | 1.50/15.0 | 0.09 | 0.94 | 6/94 | $3.50 \times 10^{-8}$ |
| 12 | 1.50/15.0 | 0.14 | 0.90 | 10/90 | $7.40 \times 10^{-8}$ |
| 13 | 1.50/15.0 | 0.43 | 0.70 | 30/70 | $7.00 \times 10^{-7}$ |
| 14 | 1.50/15.0 | 0.72 | 0.50 | 50/50 | $1.00 \times 10^{-6}$ |
| 15 | 1.50/15.0 | 1.00 | 0.30 | 70/30 | $1.50 \times 10^{-6}$ |

TABLE 4

Conductivity in Coatings Doped with 2.78 M of TM-TPD.SbF$_6$ + TM-TPD

| Sample NO. | MAKROLON/ CH$_2$Cl$_2$ weights (g/g) | TM-TPD.SbF$_6$ Weight (g) | TM-TPD Weight (g) | Molar % of TM-TPD.SbF$_6$/ TM-TPD | Conductivity (S/cm) |
|---|---|---|---|---|---|
| 16 | 0.72/10.0 | 0.03 | 1.00 | 2/98 | $3.30 \times 10^{-8}$ |
| 17 | 0.72/10.0 | 0.10 | 1.06 | 6/94 | $2.20 \times 10^{-7}$ |
| 18 | 0.72/10.0 | 0.16 | 1.00 | 10/90 | $9.00 \times 10^{-7}$ |
| 19 | 0.72/10.0 | 0.47 | 0.76 | 30/70 | $8.80 \times 10^{-6}$ |
| 20 | 0.72/10.0 | 0.78 | 0.55 | 50/50 | $1.50 \times 10^{-5}$ |
| 21 | 0.72/10.0 | 1.09 | 0.33 | 90/10 | $1.00 \times 10^{-5}$ |

Other modifications of the present invention may occur to one of ordinary skill in the art based upon a review of the present application and these modifications, including equivalents thereof, are intended to be included within the scope of the present invention.

What is claimed is:

1. A conductive coating comprising an oxidized oligomer salt, a charge transport component, and a polymer binder, wherein the oxidized oligomer salt is selected from the group consisting of oxidized oligo-arylamine salts, oxidized oligo-thiophene salts, oxidized oligo-aniline salts, oxidized porphyrin salts, oxidized tetrathiotetracene salts oxidized tetraselenotetracene salts, oxidized mono and oligo-tetrathiafulvalene salts, oligo-tetraselenafulvalene salts, oxidized oligo-metallocene salts, and mixtures thereof.

2. A conductive coating in accordance with claim 1, wherein the weight percent ratio of the oxidized oligomer salt to the charge transport compound is from about 0.01:99.99 to about 99.99:0.01, and the weight percent ratio of oxidized oligomer salts to the combined charge transport compound and polymer binder is from about 10:90 to about 90:10.

3. A conductive coating in accordance with claim 1, wherein a coating thereof with a solids concentration of about 0.1 to about 50 weight percent and with a thickness from 0.1 to about 5.0 microns, has a conductivity of from about $10^{-12}$ to about 1.0 S/cm.

4. A printing machine comprising an imaging member comprising a conductive coating in accordance with claim 1.

5. A conductive coating comprising an oxidized tetratolyl-diamine salt of the formula

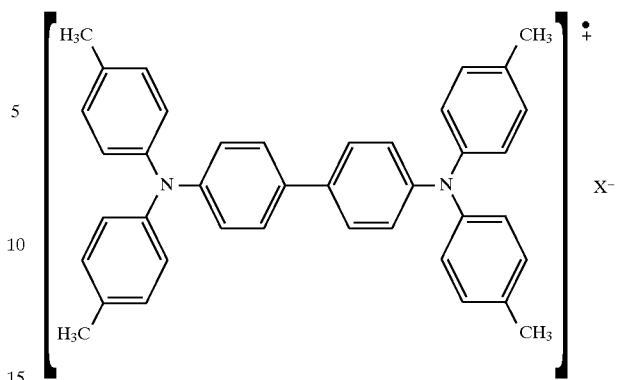

in an amount of about 0.1 to about 20 total weight percent, wherein $X^-$ is $SbF_6^-$, a charge transport component comprising a triarylamine in an amount of about 20 to about 60 total weight percent, and a polymer binder comprising a bisphenol polycarbonate in an amount of about 80 to 99.9 total weight percent.

6. A printing machine comprising an imaging member comprising a conductive coating in accordance with claim 5.

7. An electroluminescent device comprising a conductive coating comprising an oxidized oligomer salt, a charge transport component, and a polymer binder, wherein the oxidized oligomer salt is selected from the group consisting of oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof.

* * * * *